(12) United States Patent
Morris et al.

(10) Patent No.: US 12,342,518 B2
(45) Date of Patent: Jun. 24, 2025

(54) COMPARTMENTALIZED SHIELDING OF A MODULE UTILIZING SELF-SHIELDED SUB-MODULES

(71) Applicant: Qorvo US, Inc., Greensboro, NC (US)

(72) Inventors: Thomas Scott Morris, Lewisville, NC (US); Howard Terry Glascock, Oak Ridge, NC (US); Charles E. Carpenter, Orlando, FL (US); Mudar Al-Joumayly, Casselberry, FL (US); Peter Cotterill, Cary, NC (US)

(73) Assignee: Qorvo US, Inc., Greensboro, NC (US)

( * ) Notice: Subject to any disclaimer, the term of this patent is extended or adjusted under 35 U.S.C. 154(b) by 276 days.

(21) Appl. No.: 18/158,302

(22) Filed: Jan. 23, 2023

(65) Prior Publication Data

US 2023/0247814 A1    Aug. 3, 2023

Related U.S. Application Data

(60) Provisional application No. 63/400,626, filed on Aug. 24, 2022, provisional application No. 63/306,201, filed on Feb. 3, 2022.

(51) Int. Cl.
*H05K 9/00* (2006.01)
*H01F 27/36* (2006.01)
(Continued)

(52) U.S. Cl.
CPC ......... *H05K 9/0088* (2013.01); *H01F 27/363* (2020.08); *H01L 21/561* (2013.01);
(Continued)

(58) Field of Classification Search
CPC .. H05K 9/0088; H05K 9/0024; H05K 9/0031; H01F 27/363; H01F 27/022;
(Continued)

(56) References Cited

U.S. PATENT DOCUMENTS

| 5,557,142 A | 9/1996 | Gilmore et al. |
| 8,378,466 B2 | 2/2013 | Chiu et al. |

(Continued)

FOREIGN PATENT DOCUMENTS

| JP | 2013251323 A | 12/2013 |
| WO | 2018181708 A1 | 10/2018 |

(Continued)

OTHER PUBLICATIONS

Examination Report for European Patent Application No. 23154750.6, mailed Sep. 10, 2024, 13 pages.
(Continued)

*Primary Examiner* — Jacob R Crum
(74) *Attorney, Agent, or Firm* — Withrow & Terranova, P.L.L.C.

(57) ABSTRACT

The disclosure relates to a shielded electronic module which includes a module shielding structure and an electronic module with an interposer, a shielded electronic submodule over the interposer, and a module mold compound over the interposer and encapsulating sides of the shielded electronic submodule. Herein, the shielded electronic submodule includes an electronic submodule and a submodule side shielding structure, which covers sides of the electronic submodule to provide the sides of the shielded electronic submodule. A top surface of the electronic module is a combination of a top surface of the module mold compound and a top surface of the shielded electronic submodule, which is not covered by the module mold compound. The module shielding structure directly and continuously covers the top surface and sides of the electronic module, such that the submodule side shielding structure is electrically connected to the module shielding structure to individually shield the electronic submodule.

18 Claims, 9 Drawing Sheets

(51) Int. Cl.
  *H01L 21/56* (2006.01)
  *H01L 23/552* (2006.01)
  *H01F 27/02* (2006.01)
  *H01L 23/29* (2006.01)
  *H01L 23/373* (2006.01)
  *H01L 23/498* (2006.01)
  *H03H 9/54* (2006.01)

(52) U.S. Cl.
  CPC .......... *H01L 21/568* (2013.01); *H01L 23/552* (2013.01); *H01F 27/022* (2013.01); *H01L 23/295* (2013.01); *H01L 23/3736* (2013.01); *H01L 23/49833* (2013.01); *H03H 9/54* (2013.01)

(58) Field of Classification Search
  CPC ... H01L 21/561; H01L 21/568; H01L 23/552; H01L 23/295; H01L 23/3736; H01L 23/49833; H01L 2225/06537; H01L 25/0655; H01L 25/16; H03H 9/54

See application file for complete search history.

(56) References Cited

U.S. PATENT DOCUMENTS

| | | | |
|---|---|---|---|
| 2006/0203453 | A1* | 9/2006 | Chen .................... H05K 9/0032 257/E23.114 |
| 2007/0138614 | A1 | 6/2007 | Harrison et al. |
| 2012/0086108 | A1* | 4/2012 | Wu ........................ H01L 25/50 257/659 |
| 2012/0320558 | A1* | 12/2012 | Foster .................. H05K 9/0031 29/841 |
| 2017/0290209 | A1* | 10/2017 | Craig ..................... H01L 23/42 |
| 2018/0204783 | A1 | 7/2018 | Han et al. |
| 2018/0233457 | A1 | 8/2018 | Chen et al. |
| 2020/0359534 | A1 | 11/2020 | Perry et al. |
| 2022/0320008 | A1* | 10/2022 | Kusuyama ............... H05K 1/18 |

FOREIGN PATENT DOCUMENTS

| | | |
|---|---|---|
| WO | 2020250823 A1 | 12/2020 |
| WO | 2021131776 A1 | 7/2021 |

OTHER PUBLICATIONS

Extended European Search Report for European Patent Application No. 23154750.6, mailed Jun. 7, 2023, 10 pages.

* cited by examiner

COMPARTMENTALIZED SHIELDING OF A MODULE UTILIZING SELF-SHIELDED SUB-MODULES

RELATED APPLICATIONS

This application claims the benefit of provisional patent application Ser. No. 63/306,201, filed Feb. 3, 2022, and provisional patent application Ser. No. 63/400,626 filed Aug. 24, 2022, the disclosures of which are hereby incorporated herein by reference in their entireties.

FIELD OF THE DISCLOSURE

The disclosure relates to a shielded electronic module and a fabrication process for making the same.

BACKGROUND

Electronic components have become ubiquitous in modern society. The presence and strength of electromagnetic fields and signals have also become more prevalent. While many such devices depend on these signals to work, they can also include multiple components which can be damaged, interfered with, or rendered inoperable by electromagnetic fields emitted from alternative components or devices. Also of concern is the emission of unwanted electromagnetic fields which may be intercepted by, disrupted by, or interfered with the operation of alternative devices or equipment. This phenomenon is sometimes called electromagnetic interference (EMI) or crosstalk.

One way to reduce EMI is to shield the integrated circuit modules that cause EMI or that are sensitive to EMI. Typically, the shield comes in the form of a grounded enclosure covering a circuit module or a portion thereof. The grounded shield then blocks or absorbs incoming or outgoing electromagnetic emissions that could disrupt the electronic components within the enclosure, or any electromagnetic emission that may have unwanted effects if transmitted outwardly. When electromagnetic emissions from electronic components within the shield strike the interior surface of the shield, the electromagnetic emissions are electrically shorted through the grounded conductive material, thereby reducing emissions. Likewise, when emissions from outside the shield strike the exterior surface of the shield, a similar electrical short occurs, and the electronic components do not experience the emissions.

Further, it has been recognized that eddy radio frequency (RF) currents, which come from radiative components within a module, may exist within internal surfaces of the shield. When those eddy RF currents interact with other components, the performance of the overall device is negatively impacted.

As such, there is a need for an improved shielded electronic module design, which can reduce EMI with the external environment of the module and individually isolate radiative components within the module. In addition, there is also a need to manufacture the shielded electronic module in a cost-effective way without increasing the size and complexity of the final product.

SUMMARY

The disclosure relates to a shielded electronic module and a fabrication process for making the same. The disclosed shielded electronic module includes a module shielding structure and an electronic module with an interposer, a first shielded electronic submodule, and a module mold compound. Herein, the first shielded electronic submodule is attached to a top surface of the interposer and includes a first electronic submodule, a number of first submodule contacts, and a submodule side shielding structure. Each of the first submodule contacts extends from a bottom surface of the first electronic submodule to the top surface of the interposer. The submodule side shielding structure covers a side surface of the first electronic submodule to provide a side surface of the first shielded electronic submodule. The module mold compound resides over the top surface of the interposer and encapsulates the side surface of the first shielded electronic submodule, and a top surface of the first shielded electronic submodule is exposed through the module mold compound. A top surface of the electronic module is a combination of the top surface of the first shielded electronic submodule and a top surface of the module mold compound, a bottom surface of the electric module is a bottom surface of the interposer, and a side surface of the electronic module is a combination of a side surface of the interposer and a side surface of the module mold compound. The module shielding structure directly and continuously covers the top surface and the side surface of the electronic module, such that the submodule side shielding structure is electrically connected to the module shielding structure to individually shield the first electronic submodule.

In one embodiment of the disclosed shielded electronic module, a cross-section surface of the submodule side shielding structure is a portion of the top surface of the first shielded electronic submodule, such that the module shielding structure is in contact with the submodule side shielding structure.

In one embodiment of the disclosed shielded electronic module, the first shielded electronic submodule further includes a submodule top shielding structure that completely covers a top surface of the first electronic submodule and is directly connected to the submodule side shielding structure. The top surface of the first shielded electronic submodule is an outer surface of the submodule top shielding structure, such that the module shielding structure is in contact with the submodule top shielding structure.

In one embodiment of the disclosed shielded electronic module, the submodule side shielding structure includes one or more of stainless steel, copper, aluminum, silver, gold, and nickel. The submodule top shielding structure includes one or more of stainless steel, copper, aluminum, silver, gold, and nickel. The module shielding structure includes one or more of stainless steel, copper, aluminum, silver, gold, and nickel.

In one embodiment of the disclosed shielded electronic module, the submodule side shielding structure and the submodule top shielding structure have a same layer configuration.

In one embodiment of the disclosed shielded electronic module, the submodule side shielding structure and the submodule top shielding structure have different layer configurations.

In one embodiment of the disclosed shielded electronic module, the electronic module further includes a surface mounted device (SMD) attached to the top surface of the interposer. The module mold compound fully encapsulates the SMD.

In one embodiment of the disclosed shielded electronic module, the first electronic submodule includes a submodule substrate, at least one device die, a submodule mold compound, and a thermally conductive component. Herein, the at least one device die is formed on a top surface of the submodule substrate. The submodule mold compound surrounds the at least one device die. The thermally conductive component is over the at least one device die and the submodule mold compound, such that a top surface of the first electronic submodule is a top surface of the thermally conductive component, the bottom surface of the first electronic submodule is a bottom surface of the submodule substrate, and the side surface of the first electronic submodule is a combination of a side surface of the submodule substrate, a side surface of the submodule mold compound, and the side surface of the thermally conductive component.

In one embodiment of the disclosed shielded electronic module, the at least one device die is one of a flip-chip die, a wire-bonding die, a SMD, and an inductor.

In one embodiment of the disclosed shielded electronic module, the electronic module further includes a second shielded electronic submodule attached to the top surface of the interposer. The second shielded electronic submodule includes a second electronic submodule, a number of second submodule contacts extending from a bottom surface of the second electronic submodule to the top surface of the interposer, and a submodule shielding structure, which continuously covers a top surface and a side surface of the second electronic submodule, and individually shields the second electronic submodule within the electronic module. The module mold compound fully encapsulates the second shielded electronic submodule, such that the module shielding structure is not in contact with the submodule shielding structure of the second shielded electronic submodule.

In one embodiment of the disclosed shielded electronic module, the submodule side shielding structure of the first shielded electronic submodule includes one or more of stainless steel, copper, aluminum, silver, gold, and nickel. The submodule shielding structure of the second shielded electronic submodule includes one or more of stainless steel, copper, aluminum, silver, gold, and nickel. The module shielding structure includes one or more of stainless steel, copper, aluminum, silver, gold, and nickel.

In one embodiment of the disclosed shielded electronic module, the electronic module further includes an SMD attached to the surface of the interposer, and the module mold compound fully encapsulates the SMD. Herein, the SMD and the second shielded electronic submodule are located at opposite sides of the first shielded electronic submodule, such that the first shielded electronic submodule is capable of preventing electromagnetic radiation of the SMD from interfering with the second shielded electronic submodule.

According to an exemplary method of making a shielded electronic module, a molding package having a number of electronic modules is firstly provided. Herein, an inter-module area is in between two adjacent electronic modules. Each electronic module includes an interposer and a shielded electronic submodule attached to a top surface of the interposer and partially encapsulated by a module mold compound. The shielded electronic submodule includes an electronic submodule, a number of submodule contacts extending from a bottom surface of the electronic submodule to the top surface of the interposer, and a submodule side shielding structure covering a side surface of the electronic submodule. A side surface of the shielded electronic submodule is an outer surface of the submodule side shielding structure and is encapsulated by the module mold compound, and a top surface of the shielded electronic submodule is exposed through the module mold compound. Next, the molding package is singulated by dicing at each inter-module area to separate the electronic modules. A module shielding structure is applied to each electronic module to form the shielded electronic module. The module shielding structure directly and continuously covers the top surface and the side surface of a corresponding electronic module. The module shielding structure and the submodule side shielding structure of the corresponding electronic module are electrically connected.

In one embodiment of the exemplary method, the electronic module includes one or more of a flip-chip die, a wire-bonding die, a SMD, and an inductor.

In one embodiment of the exemplary method, providing the molding package includes providing a molding precursor package with a number of electronic precursor modules. Herein, one inter-module area is in between two adjacent electronic precursor modules. Each electronic precursor module includes the interposer and an intact shielded electronic submodule attached to the top surface of the interposer and fully encapsulated by the module mold compound. The intact shielded electronic submodule includes the electronic submodule, the submodule contacts, and an intact submodule shielding structure, which includes the submodule side shielding structure covering the side surface of the electronic submodule, and an intact submodule top shielding structure completely covering the top surface of the electronic submodule and directly connecting the submodule side shielding structure. Next, the module mold compound is thinned down to provide the molding package. The top surface of each shielded electronic submodule is exposed through the module mold compound. Each electronic precursor module converts to a corresponding electronic module.

In one embodiment of the exemplary method, the module mold compound is thinned down to expose the top surface of each electronic submodule and a cross-section surface of the submodule side shielding structure at a periphery of a corresponding electronic submodule. The cross-section surface of the submodule side shielding structure is a portion of the top surface of the shielded electronic submodule. The intact submodule top shielding structure is completely removed during the thinning step.

In one embodiment of the exemplary method, the intact submodule top shielding structure includes a number of shielding layers. The module mold compound is thinned down to expose one of the shielding layers, and the intact submodule top shielding structure converts to a submodule top shielding structure. An outer surface of the submodule top shielding structure is the top surface of the shielded electronic submodule.

In one embodiment of the exemplary method, the intact submodule shielding structure includes one or more of stainless steel, copper, aluminum, silver, gold, and nickel. The module shielding structure includes one or more of stainless steel, copper, aluminum, silver, gold, and nickel.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
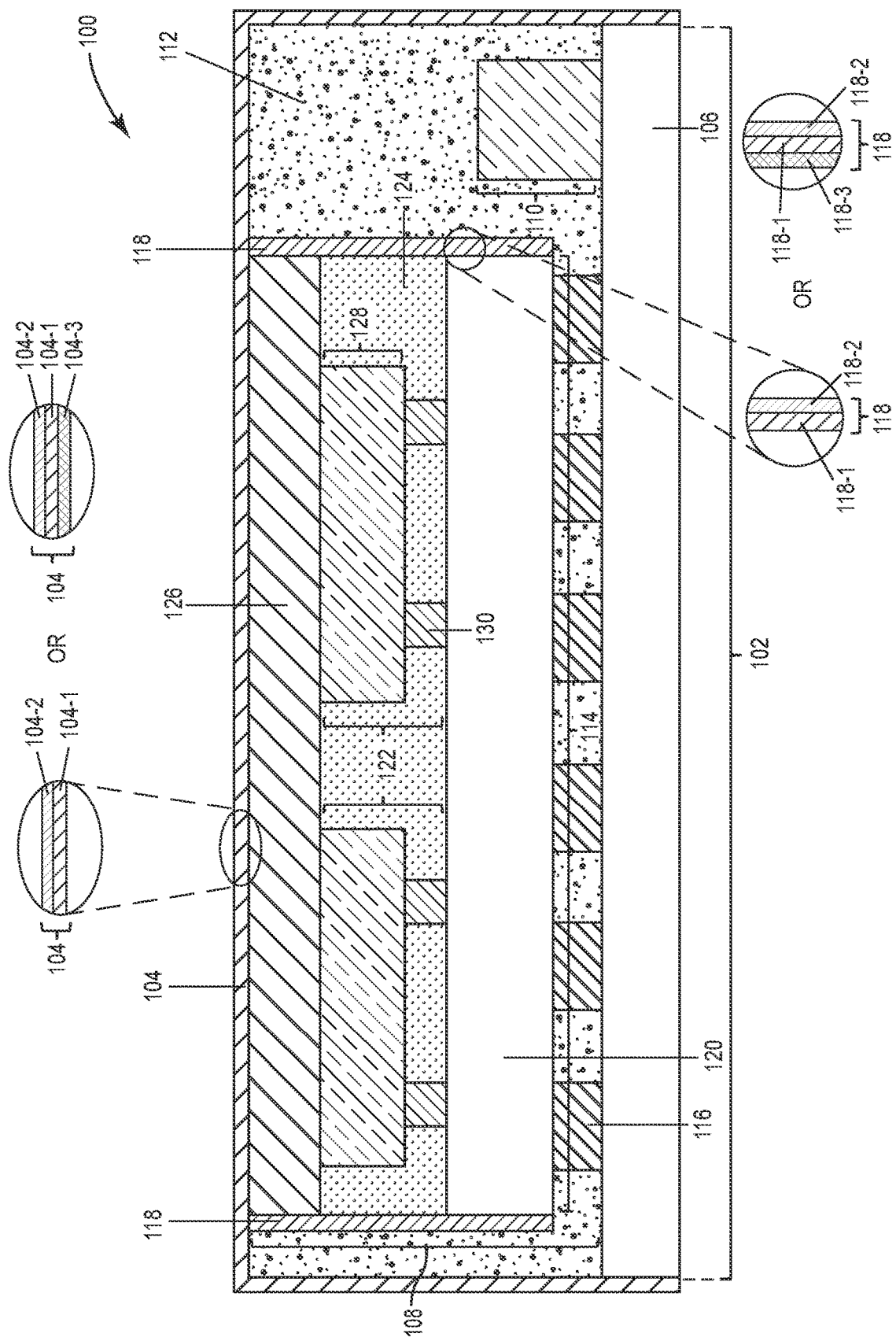
FIGS. 1A and 1B illustrate an exemplary shielded electronic module according to some embodiments of the present disclosure.

It will be understood that for clear illustrations, FIGS. 1A-7 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The disclosure relates to a shielded electronic module, which is capable of reducing electromagnetic interference (EMI) with an external environment of the module and is capable of individually isolating radiative components within the module, and a fabrication process to provide the shielded electronic module. FIG. 1A illustrates an exemplary shielded electronic module 100 composed of an electronic module 102 with a module shielding structure 104 according to some embodiments of the present disclosure. For the purpose of this illustration, the electronic module 102 includes an interposer 106, a shielded electronic submodule 108, a surface mounted device (SMD) 110, and a module mold compound 112. In different applications, the electronic module 102 may include multiple shielded electronic submodules 108 and/or fewer or more SMDs 110.

Within the electronic module 102, the shielded electronic submodule 108 and the SMD 110 are attached to a top surface of the interposer 106. The module mold compound 112 resides over the top surface of the interposer 106, encapsulates at least a side surface of the shielded electronic submodule 108, and fully encapsulates the SMD 110. The module mold compound 112 may be an organic epoxy resin system. In this embodiment, a top surface of the electronic module 102 is a combination of a top surface of the shielded electronic submodule 108 and a top surface of the module mold compound 112, a bottom surface of the electronic module 102 is a bottom surface of the interposer 106, and a side surface of the electronic module 102 is a combination of a side surface of the module mold compound 112 and a side surface of the interposer 106. The module shielding structure 104 directly and completely covers the top surface of the electronic module 102 and completely covers the side surface of the electronic module 102, while the bottom surface of the electronic module 102 is exposed. Herein and hereafter, completely covering a surface refers to covering at least 99% of such surface.

In detail, the module shielding structure 104 includes at least a first module shielding layer 104-1 and a second module shielding layer 104-2. The first module shielding layer 104-1 completely covers the top surface and the side surface of the electronic module 102, and may be formed of copper, aluminum, silver, gold, or other conductive materials with a thickness between 3 μm and 16 μm. The second module shielding layer 104-2 resides over the first module shielding layer 104-1 and may be formed of stainless steel or nickel with a thickness between 0.3 μm and 3 μm. In order to achieve a superior adhesion, the module shielding structure 104 may further include a third module shielding layer 104-3 (as a seed layer) that is formed of stainless steel, copper, aluminum, silver, gold, or other conductive materials with a thickness between 0.1 μm and 1.5 μm. The third module shielding layer 104-3 may directly and completely cover the top surface and the side surface of the electronic module 102, and the first module shielding layer 104-1 resides over the third module shielding layer 104-3. For a non-limited example, the third module shielding layer 104-3 (as the seed layer) is formed of stainless steel with a 0.1 μm thickness, the first module shielding layer 104-1 is formed of copper with a 4 μm thickness, and the second module shielding layer 104-2 is formed of stainless steel with a 0.3 μm thickness.

The interposer 106 is a multilayer laminate. The interposer 106 is configured to provide electrical connections between the electronic components within the electronic module 102 (e.g., between the shielded electronic submodule 108 and the SMD 110) and electrical connections between the electronic components of the electronic module 102 and external electronic components (not shown for simplicity). The interposer 106 also provides mechanical support to the shielded electronic submodule 108 and the SMD 110. The interposer 106 may include a ground plane electrically connected to the module shielding structure 104 (not shown).

The shielded electronic submodule 108 is composed of an electronic submodule 114, multiple submodule contacts 116 (only one submodule contact is marked with a reference number for clarity), and a submodule side shielding structure 118. Each submodule contact 116 extends from a bottom surface of the electronic submodule 114 to the top surface of the interposer 106 and electrically connects the electric components within the electronic submodule 114 to the interposer 106. The module mold compound 112 fills gaps among the submodule contacts 116 between the bottom surface of the electronic submodule 114 and the top surface of the interposer 106. The submodule side shielding structure 118 completely covers a side surface of the electronic submodule 114.

Herein, the submodule contacts 116 are conductive, and may be solder balls or copper pillars. The submodule side shielding structure 118 includes at least a first submodule shielding layer 118-1 and a second submodule shielding layer 118-2. The first submodule shielding layer 118-1 completely covers the side surface of the electronic submodule 114, and may be formed of copper, aluminum, silver, gold, or other conductive materials with a thickness between 3 μm and 16 μm. The second submodule shielding layer 118-2 resides over the first submodule shielding layer 118-1 and may be formed of stainless steel or nickel with a thickness between 0.1 μm and 3 μm. In order to achieve a superior adhesion, the submodule side shielding structure 118 may further include a third submodule shielding layer 118-3 (as a seed layer) that is formed of stainless steel, copper, aluminum, silver, gold, or other conductive materials with a thickness between 0.3 μm and 1.5 μm. The third submodule shielding layer 118-3 may directly and completely cover the side surface of the electronic submodule 114, and the first submodule shielding layer 118-1 resides over the third submodule shielding layer 118-3. For a non-limited example, the third submodule shielding layer 118-3 (as the seed layer) is formed of stainless steel with a 0.1 μm thickness, the first submodule shielding layer 118-1 is formed of copper with a 4 μm thickness, and the second submodule shielding layer 118-2 is formed of stainless steel with a 0.3 μm thickness.

For the purpose of this illustration, the electronic submodule 114 includes a submodule substrate 120, two device dies 122, a submodule mold compound 124, and a thermally conductive component 126. In one embodiment, the device dies 122 are flip-chip dies, each of which has a die body 128 and multiple die contacts 130 (only one die contact is marked with a reference number for clarity). In different applications, the electronic submodule 114 may include fewer or more device dies 122, and one or more device dies 122 may be wire-bonding dies, SMDs, inductors, and/or other active/passive device components.

The device dies 122 are formed on a top surface of the submodule substrate 120, where each die contact 130 extends from a bottom surface of a corresponding die body 128 to the top surface of the submodule substrate 120. The submodule mold compound 124 surrounds each device die 122 and underfills each device die 122 (i.e., fills gaps among the die contacts 130 between the bottom surface of each device die 122 and the top surface of the submodule substrate 120). In one embodiment, a top surface of each device die 122 is not covered by the submodule mold compound 124. The thermally conductive component 126 is provided over the device dies 122 and in contact with each top surface of the device die 122. In one embodiment, the top surface of at least one device die 122 is not covered by the submodule mold compound 124 and is in contact with the thermally conductive component 126, while at least one device die 122 is fully encapsulated by the submodule mold compound 124 (i.e., the submodule mold compound 124 covers the top and side surfaces of the die body 128 and underfills the device die 122) and is located underneath the thermally conductive component 126 without contact (not shown). In one embodiment, each device die 122 is fully encapsulated by the submodule mold compound 124 and is located underneath the thermally conductive component 126 without contact (not shown).

Herein, the side surface of the electronic submodule 114 is a combination of a side surface of the submodule substrate 120, a side surface of the submodule mold compound 124, and a side surface of the thermally conductive component 126. A top surface of the electronic submodule 114 is a top surface of the thermally conductive component 126, and the top surface of the shielded electronic submodule 108 is a combination of the top surface of the thermally conductive component 126 with a cross-section surface of the submodule side shielding structure 118 at the periphery of the electronic submodule 114. Since the module shielding structure 104 directly and completely covers the top surface of the electronic module 102 (i.e., directly and completely covers the shielded electronic submodule 108), the module shielding structure 104 is in contact with the thermally conductive component 126 and the submodule side shielding structure 118. As a result, once the module shielding structure 104 is grounded, the submodule side shielding structure 118 is also grounded. The electronic submodule 114 is fully and individually shielded (except the bottom surface of the electronic submodule 114) by a combination of the module shielding structure 104 and the submodule side shielding structure 118. The module shielding structure 104 and the submodule side shielding structure 118 may have a same layer arrangement with same layer materials, or have the same layer arrangement with different layer materials, or have the different layer arrangements with different layer materials.

The submodule substrate 120 may be a multilayer redistribution structure with multiple redistribution layers (RDLs), which is configured to provide electrical connections between the device dies 122 within the electronic submodule 114 and electrical connections between the device dies 122 and the corresponding submodule contacts 116 (not shown for simplicity). As such, the device dies 122 within the electronic submodule 114 can be electrically connected to the SMD 110 via the submodule substrate 120, the submodule contacts 116, and the interposer 106.

The device dies 122 may be radiative components or electronic components that are superiorly sensitive to external interference (e.g., Bulk Acoustic Wave (BAW) resonators/filters or Surface Acoustic Wave (SAW) resonators/filters). Since the electronic submodule 114 is fully and individually shielded (except the bottom surface of the electronic submodule 114) by the combination of the module shielding structure 104 and the submodule side shielding structure 118, the electromagnetic field generated by the device dies 122 will not affect electronic components outside the shielded electronic submodule 108 and the electromagnetic field outside the shielded electronic submodule 108 will not affect the device dies 122 within the shielded electronic submodule 108.

The submodule mold compound 124 may be an organic epoxy resin system. In some temperature sensitive applications, the submodule mold compound 124 may have a thermal conductivity greater than 1 W/m·K and may be formed of thermoplastics or thermoset polymer materials, such as polyphenylene sulfide (PPS), epoxy doped with boron nitride, aluminum nitride, alumina, carbon nanotubes, or diamond-like thermal additives, or the like. The thermally conductive component 126 is formed of a thermally conductive material, such as epoxy doped with boron nitride, aluminum nitride, alumina, graphene, or other inorganic material. The thermally conductive component 126 and the submodule mold compound 124 may be formed of a same material during a same process. In order to further enhance the thermal performance, the thermally conductive component 126 may be formed of sintered copper, sintered silver, silver filled epoxy, or other metals.

Figure 1B:
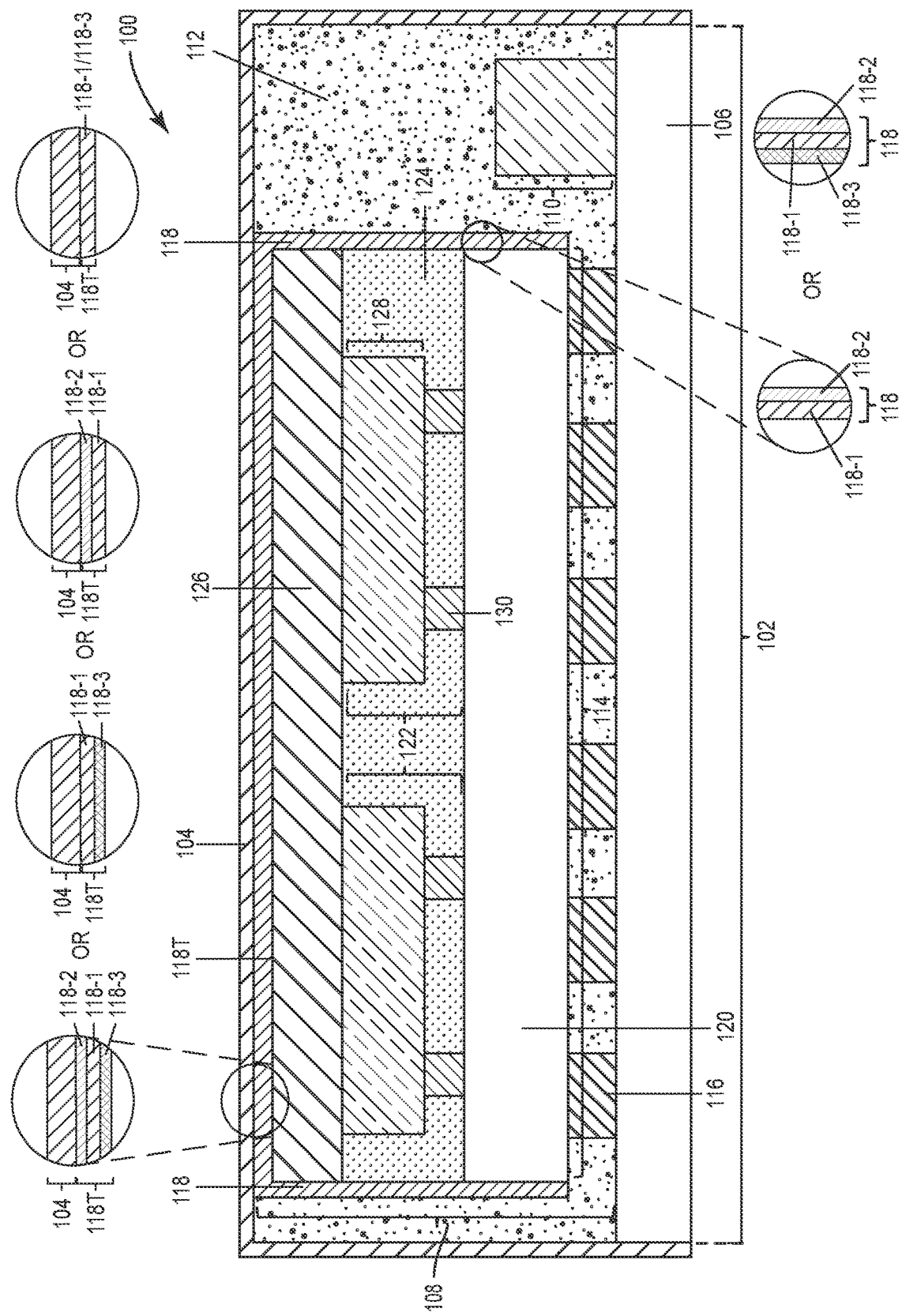

As illustrated in FIG. 1A, the submodule side shielding structure 118 included in the shielded electronic submodule 108 only covers the side surface of the electronic submodule 114 but does not cover the top surface of the electronic submodule 114, and the module shielding structure 104 is in contact with the thermally conductive component 126 of the electronic submodule 114. In some applications, the shielded electronic submodule 108 may further include a submodule top shielding structure 118T, which fully covers the top surface of the electronic submodule 114 and directly connects the submodule side shielding structure 118, as illustrated in FIG. 1B.

Herein, in some applications, the submodule top shielding structure 118T may include the third submodule shielding layer 118-3 over the top surface of the thermally conductive component 126, the first submodule shielding layer 118-1 over the third submodule shielding layer 118-3, and the second submodule shielding layer 118-2 over the first submodule shielding layer 118-1, where the module shielding structure 104 is in contact with the second submodule shielding layer 118-2. In some applications, the submodule top shielding structure 118T may include the third submodule shielding layer 118-3 over the top surface of the thermally conductive component 126 and the first submodule shielding layer 118-1 over the third submodule shielding layer 118-3, where the module shielding structure 104 is in contact with the first submodule shielding layer 118-1. In some applications, the submodule top shielding structure 118T may only include the third submodule shielding layer 118-3 over the top surface of the thermally conductive component 126, where the module shielding structure 104 is in contact with the third submodule shielding layer 118-3. In some applications, the submodule top shielding structure 118T may include the first submodule shielding layer 118-1 over the top surface of the thermally conductive component 126 and the second submodule shielding layer 118-2 over the first submodule shielding layer 118-1, where the module shielding structure 104 is in contact with the second submodule shielding layer 118-2. In some applications, the submodule top shielding structure 118T may only include the first submodule shielding layer 118-1 over the top surface of the thermally conductive component 126, where the module shielding structure 104 is in contact with the second submodule shielding layer 118-2.

In this embodiment, regardless of the layer arrangement of the submodule top shielding structure 118T, the top surface of the shielded electronic submodule 108 is always an outer surface of the submodule top shielding structure 118T, and the module shielding structure 104 is in contact with the submodule top shielding structure 118T instead of the thermally conductive component 126. As a result, once the module shielding structure 104 is grounded, the submodule top shielding structure 118T and the submodule side shielding structure 118 are also grounded. The electronic submodule 114 is fully and individually shielded (except the bottom surface of the electronic submodule 114) by a combination of the module shielding structure 104, the submodule top shielding structure 118T and the submodule side shielding structure 118.

Figure 2:
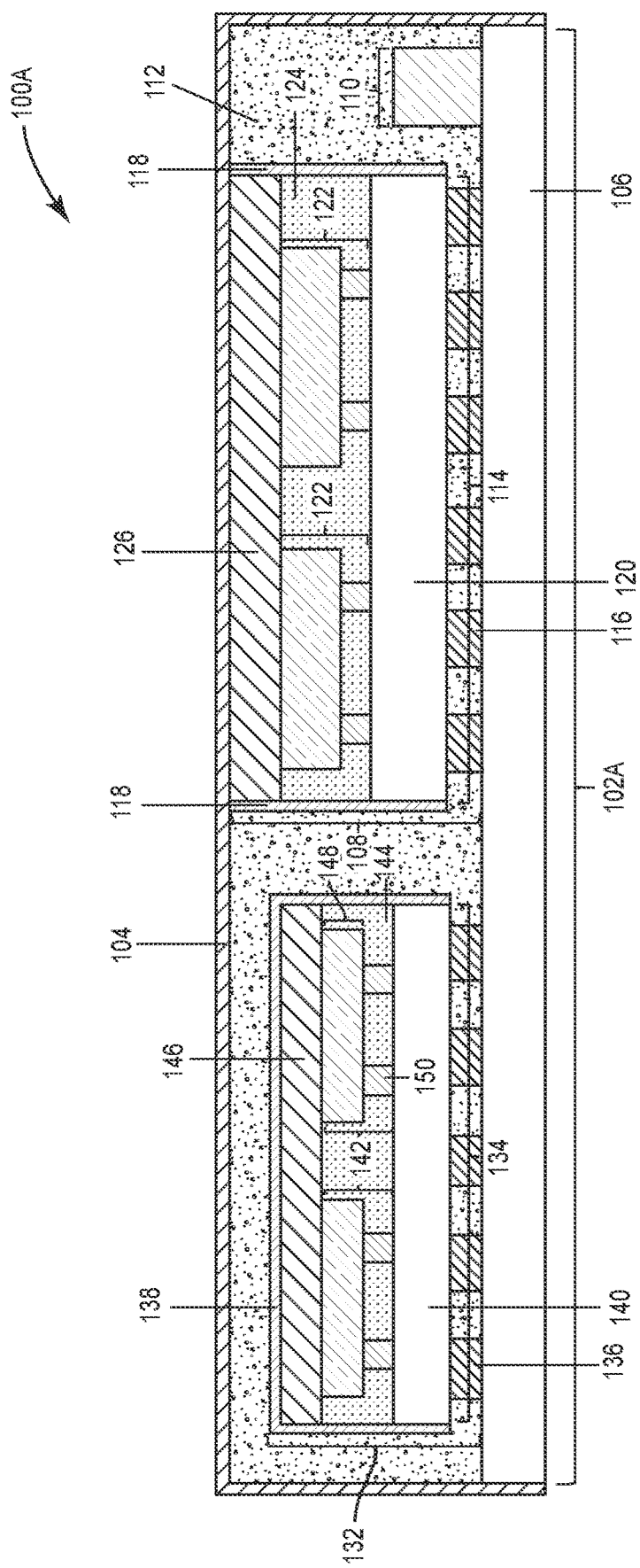
FIG. 2 illustrates an alternative shielded electronic module according to some embodiments of the present disclosure.

Within the shielded electronic module 100, the module shielding structure 104 is in contact with the submodule side shielding structure 118/submodule top shielding structure 118T of the shielded electronic submodule 108. As such, the shielded electronic submodule 108 is shielded to the same ground as the shielded electronic module 100. In some applications, an alternative shield electronic module 100A, besides the shielded electronic submodule 108, may further include an alternative shielded electronic submodule 132 that is not in contact with the module shielding structure 104, as illustrated in FIG. 2.

The alternative shielded electronic module 100A is composed of an alternative electronic module 102A with the module shielding structure 104 according to some embodiments of the present disclosure. For the purpose of this illustration, the alternative electronic module 102A includes the interposer 106, the shielded electronic submodule 108, the alternative shielded electronic submodule 132 shorter than the shielded electronic submodule 108, the SMD 110, and the module mold compound 112. In different applications, the alternative electronic module 102A may include multiple shielded electronic submodules 108, multiple alternative shielded electronic submodules 132, and/or fewer or more SMDs 110.

Like the shielded electronic submodule 108 and the SMD 110, the alternative shielded electronic submodule 132 is also attached to the top surface of the interposer 106. The module mold compound 112 resides over the top surface of the interposer 106, encapsulates the side surface of the shielded electronic submodule 108, fully encapsulates the SMD 110, and also fully encapsulates the alternative shielded electronic submodule 132. As such, neither a top surface nor a side surface of the alternative shielded electronic submodule 132 is exposed through the module mold compound 112, and the module shielding structure 104 is not in contact with any portion of the alternative shielded electronic submodule 132. In one embodiment, the alternative shielded electronic submodule 132 and the SMD 110 are separate from each other by the shielded electronic submodule 108. Since the shielded electronic submodule 108 extends vertically from the top surface of the interposer 106 to the module shielding structure 104, the shielded electronic submodule 108 (i.e., the submodule side shielding structure 118 of the shielded electronic submodule 108) is capable of preventing electromagnetic radiation of components on one side of the alternative shield electronic module 100A from interfering with other components on the opposite side of the alternative shield electronic module 100A (e.g., the shielded electronic submodule 108 is capable of preventing the electromagnetic radiation of the SMD 110 from interfering with the alternative shielded electronic submodule 132).

In detail, the alternative shielded electronic submodule 132 is composed of an alternative electronic submodule 134, multiple alternative submodule contacts 136 (only one alternative submodule contact is marked with a reference number for clarity), and an alternative submodule shielding structure 138. Each alternative submodule contact 136 is conductive (e.g., a solder ball or a copper pillar) and extends from a bottom surface of the alternative electronic submodule 134 to the top surface of the interposer 106 and electrically connects the electric components within the alternative electronic submodule 134 to the interposer 106. The module mold compound 112 fills gaps among the alternative submodule contacts 136 between the bottom surface of the alternative electronic submodule 134 and the top surface of the interposer 106. The alternative submodule shielding structure 138 completely covers a top surface and a side surface of the alternative electronic submodule 134.

The alternative submodule shielding structure 138 may have a same layer arrangement as the submodule side shielding structure 118. For the purpose of this illustration, the alternative electronic submodule 134 includes an alternative submodule substrate 140, two alternative device dies 142, an alternative submodule mold compound 144, and an alternative thermally conductive component 146. In one embodiment, the alternative device dies 142 are flip-chip dies, each of which has a die body 148 and multiple die contacts 150 (only one die contact is marked with a reference number for clarity). In different applications, the alternative electronic submodule 134 may include fewer or more alternative device dies 142, and one or more alternative device dies 142 may be wire-bonding dies, SMDs, inductors, and/or other active/passive device components.

The alternative device dies 142 are formed on a top surface of the alternative submodule substrate 140, where each die contact 150 extends from a bottom surface of a corresponding die body 148 to the top surface of the alternative submodule substrate 140. The alternative submodule substrate 140 may be a multilayer redistribution structure with multiple RDLs, which is configured to provide electrical connections between the alternative device dies 142 within the alternative electronic submodule 134 and electrical connections between the alternative device dies 142 and the corresponding alternative submodule contacts 136 (not shown for simplicity). The alternative device dies 142 may be radiative components or electronic components that are superiorly sensitive to external interference (e.g., BAW resonators/filters or SAW resonators/filters). Since the alternative electronic submodule 134 is fully and individually shielded (except the bottom surface of the alternative electronic submodule 134), the electromagnetic field generated by the alternative device dies 142 will not affect electronic components outside the alternative shielded electronic submodule 132 and the electromagnetic field outside the alternative shielded electronic submodule 132 will not affect the alternative device dies 142 within the alternative shielded electronic submodule 132.

The alternative submodule mold compound 144 surrounds each alternative device die 142 and underfills each alternative device die 142 (i.e., fills gaps among the die contacts 150 between the bottom surface of each alternative device die 142 and the top surface of the alternative submodule substrate 140). In one embodiment, a top surface of each alternative device die 142 is not covered by the alternative submodule mold compound 144. The alternative thermally conductive component 146 is provided over the alternative device die 142 and is in contact with each top surface of the alternative device die 142. In one embodiment, the top surface of at least one alternative device die 142 is not covered by the alternative submodule mold compound 144 and in contact with the alternative thermally conductive component 146, while at least one alternative device die 142 is fully encapsulated by the alternative submodule mold compound 144 (i.e., the alternative submodule mold compound 144 covers the top and side surfaces of the die body 148 and underfills the alternative device die 142) and is located underneath the alternative thermally conductive component 146 without contact (not shown). In one embodiment, each alternative device die 142 is fully encapsulated by the alternative submodule mold compound 144 and is located underneath the alternative thermally conductive component 146 without contact (not shown).

Herein, the side surface of the alternative electronic submodule 134 is a combination of a side surface of the alternative submodule substrate 140, a side surface of the alternative submodule mold compound 144, and a side surface of the alternative thermally conductive component 146. A top surface of the alternative electronic submodule 134 is a top surface of the alternative thermally conductive component 146. Since the alternative submodule shielding structure 138 completely covers the top surface and the side surface of the alternative electronic submodule 134, a top surface and a side surface of the alternative shielded electronic submodule 132 are an outer surface of the alternative submodule shielding structure 138. The module shielding structure 104 is not in contact with the alternative submodule shielding structure 138, but is separate from the alternative submodule shielding structure 138 by the module mold compound 112. In one embodiment, the alternative submodule shielding structure 138 of the alternative shielded electronic submodule 132 is electrically coupled to a different ground from the module shielding structure 104 of the alternative shield electronic module 100A/the submodule side shielding structure 118 of the shielded electronic submodule 108. In one embodiment, the alternative submodule shielding structure 138 of the alternative shielded electronic submodule 132 is electrically coupled to a same ground as the module shielding structure 104 of the alternative shield electronic module 100A/the submodule side shielding structure 118 of the shielded electronic submodule 108, e.g., via the alternative submodule substrate 140, the alternative submodule contacts 136, and the interposer 106.

The alternative submodule mold compound 144 may be an organic epoxy resin system. In some temperature sensitive applications, the alternative submodule mold compound 144 may have a thermal conductivity greater than 1 W/m·K and may be formed of thermoplastics or thermoset polymer materials, such as PPS, epoxy doped with boron nitride, aluminum nitride, alumina, carbon nanotubes, or diamond-like thermal additives, or the like. The alternative thermally conductive component 146 is formed of a thermally conductive material, such as epoxy doped with boron nitride, aluminum nitride, alumina, graphene, or other inorganic material. Similar to the thermally conductive component 126 and the submodule mold compound 124 within the shielded electronic submodule 108, the alternative thermally conductive component 146 and the alternative submodule mold compound 144 may be formed of a same material during a same process. In order to further enhance the thermal performance, the alternative thermally conductive component 146 may be formed of sintered copper, sintered silver, silver filled epoxy, or other metals.

FIGS. 3-7 provide exemplary steps that illustrate a manufacturing process to implement the shielded electronic module 100 shown in FIG. 1A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-7.

Figure 3:
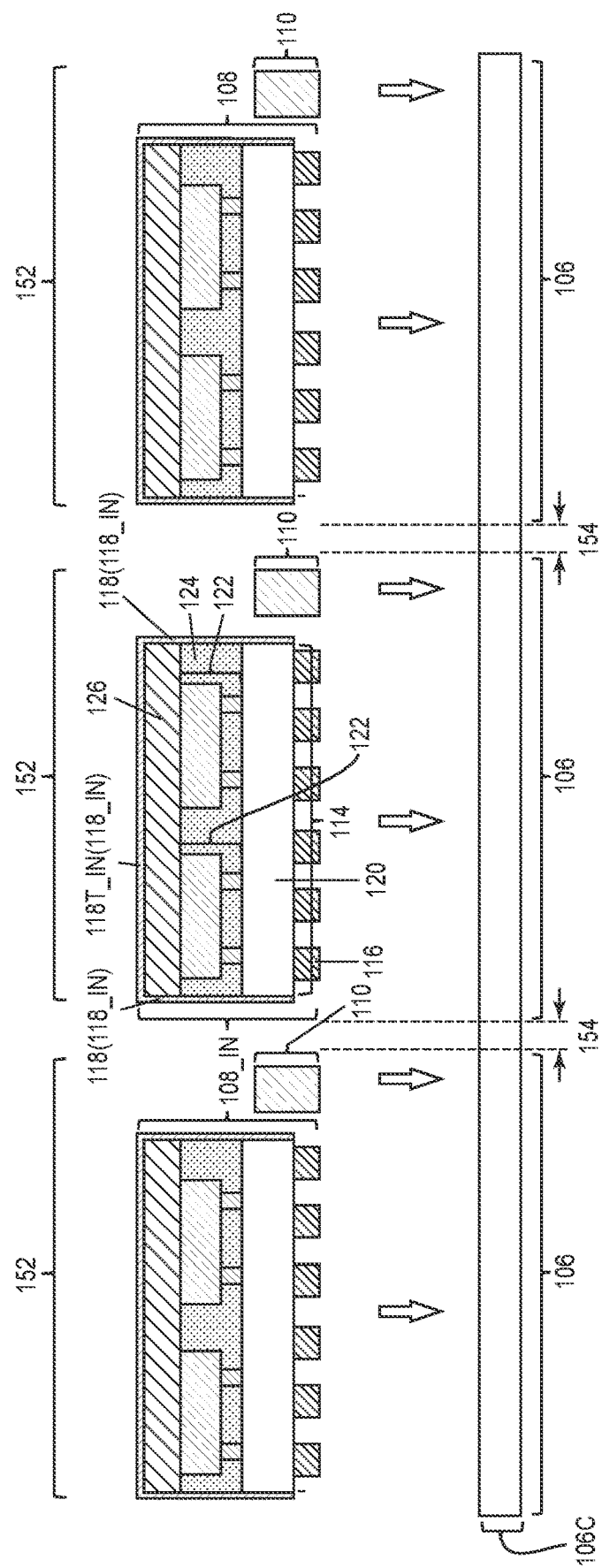
FIGS. 3-7 illustrate an exemplary manufacturing process to implement the shielded electronic module shown in FIG. 1A.

Initially, a number of electronic component groups 152 are attached to a top surface of a common interposer 106C as illustrated in FIG. 3. The common interposer 106C includes a number of the interposers 106, and a number of inter-module areas 154. Each inter-module area 154 connects and is in between adjacent interposers 106. Each electronic component group 152 is attached to a corresponding interposer 106, and does not reside on any inter-module area 154. For the purpose of this illustration, each electronic component group 152 includes an intact shielded electronic submodule 108_IN and the SMD 110. In different applications, each electronic component group 152 may include fewer or more electronic components.

Herein, each intact shielded electronic submodule 108_IN is composed of the electronic submodule 114, the submodule contacts 116 (only one submodule contact is marked with a reference number for clarity), and an intact submodule shielding structure 118_IN. The submodule contacts 116 of one intact shielded electronic submodule 108_IN extend from a bottom surface of a corresponding electronic submodule 114 towards a top surface of a corresponding interposer 106 and electrically connects the electric components within the corresponding electronic submodule 114 to the corresponding interposer 106. The intact submodule shielding structure 118_IN is continuously and completely covering a top surface and a side surface of the corresponding electronic submodule 114. The intact submodule shielding structure 118_IN includes the submodule side shielding structure 118, which completely covers the side surface of the corresponding electronic submodule 114, and an intact submodule top shielding structure 118T_IN, which completely covers the top surface of the corresponding electronic submodule 114 and directly connects the submodule side shielding structure 118. As such, the intact submodule top shielding structure 118T_IN is in contact with the top surface of the thermally conductive component 126 of the corresponding electronic submodule 114, and a top surface of each intact submodule shielding structure 118_IN is an outer surface of the intact submodule top shielding structure 118T_IN. The intact submodule top shielding structure 118T_IN and the submodule side shielding structure 118 are formed in a same shielding process and have a same layer arrangement with the same materials.

Figure 4:
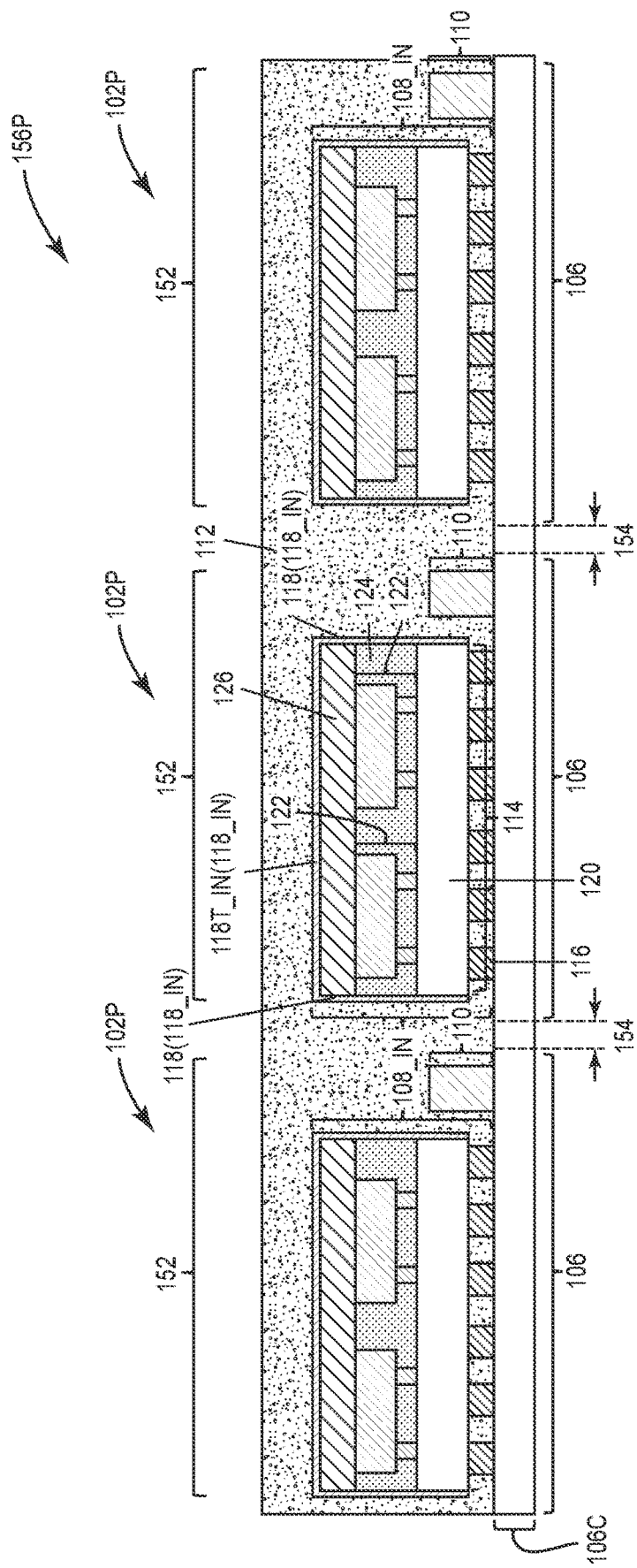

Next, the module mold compound 112 is applied over the top surface of the common interposer 106C to provide a molding precursor package 156P, which includes multiple electronic precursor modules 102P, as illustrated in FIG. 4. Within each electronic precursor module 102P, the module mold compound 112 encapsulates a top surface and a side surface of each intact shielded electronic submodule 108_IN (i.e., the module mold compound 112 is in contact with the intact submodule shielding structure 118_IN) and fills gaps among the submodule contacts 116 between a bottom surface of each intact shielded electronic submodule 108_IN and the top surface of the common interposer 106C. In addition, the module mold compound 112 encapsulates a top surface and a side surface of each SMD 110. The module mold compound 112 may be applied by various procedures, such as sheet molding, overmolding, compression molding, transfer molding, dam fill encapsulation, or screen print encapsulation. A curing process (not shown) is followed to harden the module mold compound 112. The curing temperature is between 100° C. and 320° C. depending on which material is used as the module mold compound 112.

Figure 5A:
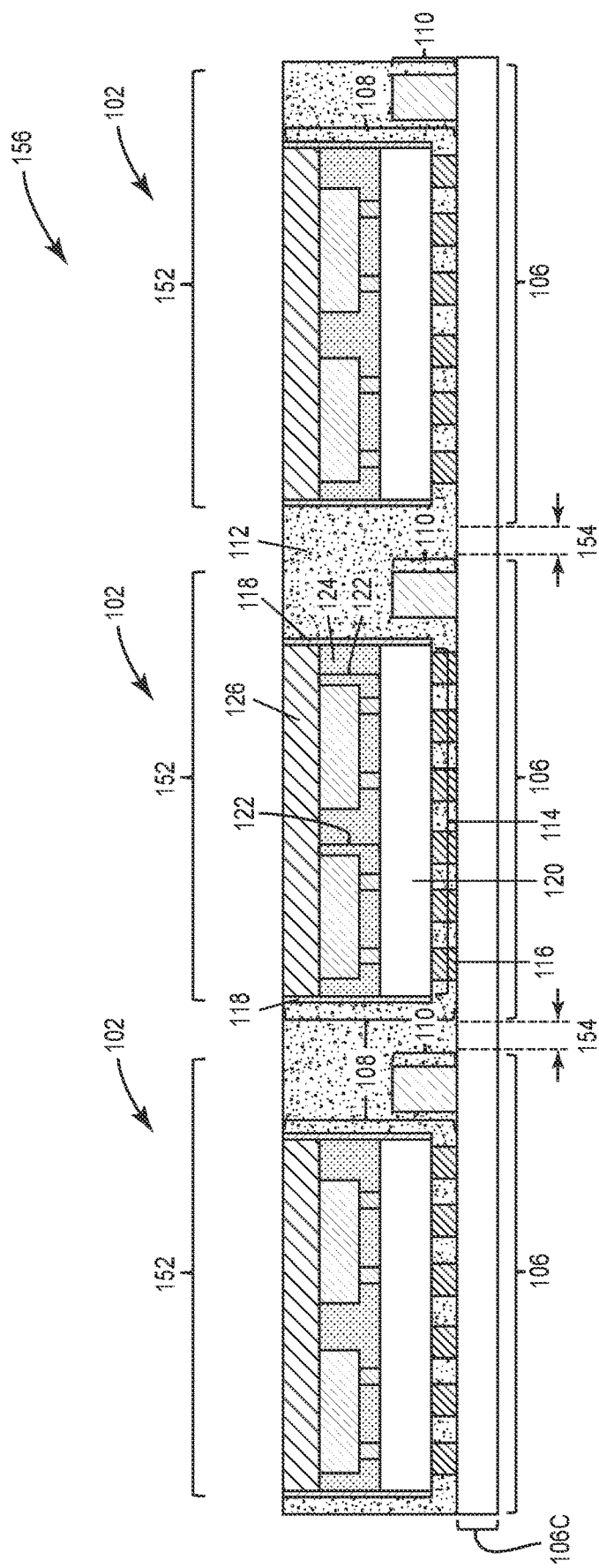

The module mold compound 112 is then thinned down to provide a molding package 156, which includes multiple electronic modules 102, as illustrated in FIG. 5A. The module mold compound 112 is thinned down until the thermally conductive component 126 of each electronic submodule 114 and the cross-section surface of the submodule side shielding structure 118 at the periphery of each electronic submodule 114 are exposed. Herein, the intact submodule top shielding structure 118T_IN of each intact shielded electronic submodule 108_IN is completely removed, and each intact shielded electronic submodule 108_IN converts to the shielded electronic submodule 108. The thinning procedure may be done with a mechanical grinding process. Since each SMD 110 has a lower height than the intact shielded electronic submodules 108_IN, each SMD 110 is not exposed and is still encapsulated by the module mold compound 112.

Figure 5B:
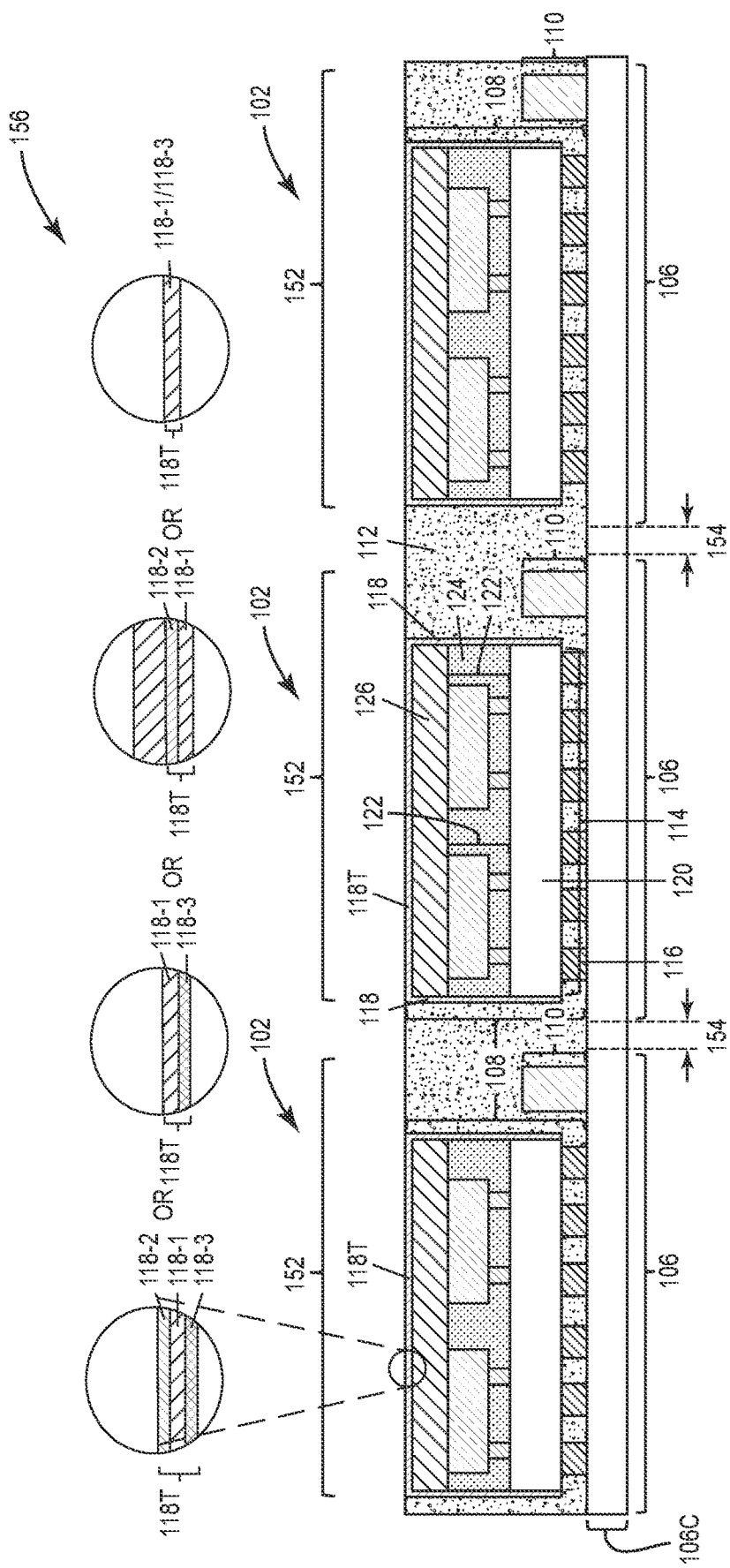

In some applications, the intact submodule top shielding structure 118T_IN of each intact shielded electronic submodule 108_IN may not be completely removed during the thinning procedure. Instead, the module mold compound 112 is thinned down to expose one submodule shielding layer (e.g., the second submodule shielding layer 118-2, the first submodule shielding layer 118-1, or the third submodule shielding layer 118-3) within each submodule top shielding structure 118T_IN, as illustrated in FIG. 5B. Each intact submodule top shielding structure 118T_IN converts to the submodule top shielding structure 118T, and each intact shielded electronic submodule 108_IN converts to the shielded electronic submodule 108.

If the intact submodule top shielding structure 118T_IN includes the third submodule shielding layer 118-3 over the thermally conductive component 126, the first submodule shielding layer 118-1 over the third submodule shielding layer 118-3, and the second submodule shielding layer 118-2 over the second submodule shielding layer 118-1, the module mold compound 112 may be thinned down until the second submodule shielding layer 118-2 is exposed, or until the first submodule shielding layer 118-1 is exposed, or until the third submodule shielding layer 118-3 is exposed. As such, the submodule top shielding structure 118T for each shielded electronic submodule 108 may include the third, first, and second submodule shielding layers 118-3, 118-1, and 118-2, or may include the third and first submodule shielding layers 118-3 and 118-1, or may only include the third submodule shielding layer 118-3. If the intact submodule top shielding structure 118T_IN includes the first submodule shielding layer 118-1 over the thermally conductive component 126 and the second submodule shielding layer 118-2 over the second submodule shielding layer 118-1, the module mold compound 112 may be thinned down until the second submodule shielding layer 118-2 is exposed, or until the first submodule shielding layer 118-1 is exposed. As such, the submodule top shielding structure 118T for each shielded electronic submodule 108 may include the first and second submodule shielding layers 118-1 and 118-2, or may only include the first submodule shielding layer 118-1.

Regardless of the layer arrangement of the submodule top shielding structure 118T, the top surface of the shielded electronic submodule 108, which is exposed through the module mold compound 112, is always the outer surface of the submodule top shielding structure 118T. In addition, the submodule top shielding structure 118T always fully covers the top surface of the corresponding electronic submodule 114 and directly connects the corresponding submodule side shielding structure 118.

Figure 6:
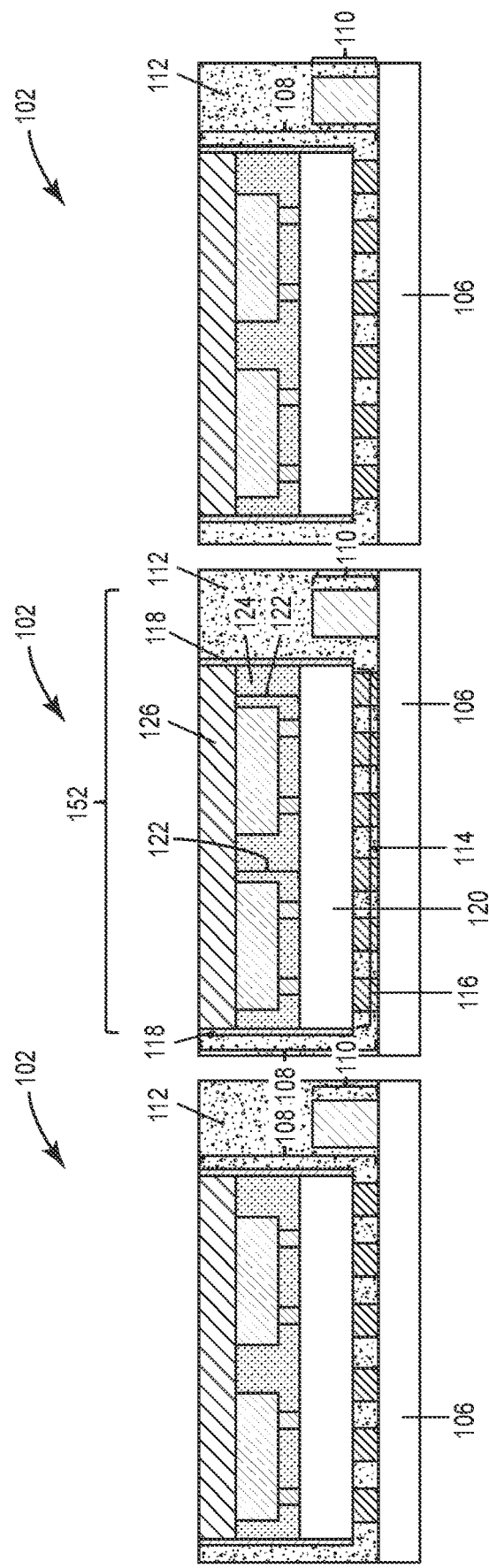

FIG. 6 shows a singulating step to singulate the molding package 156 into individual electronic modules 102. The singulating step may be provided by a probing and dicing process at each inter-module area 154. The common interposer 106C is singulated into individual interposers 106, each of which is included in a corresponding electronic module 102.

Figure 7:
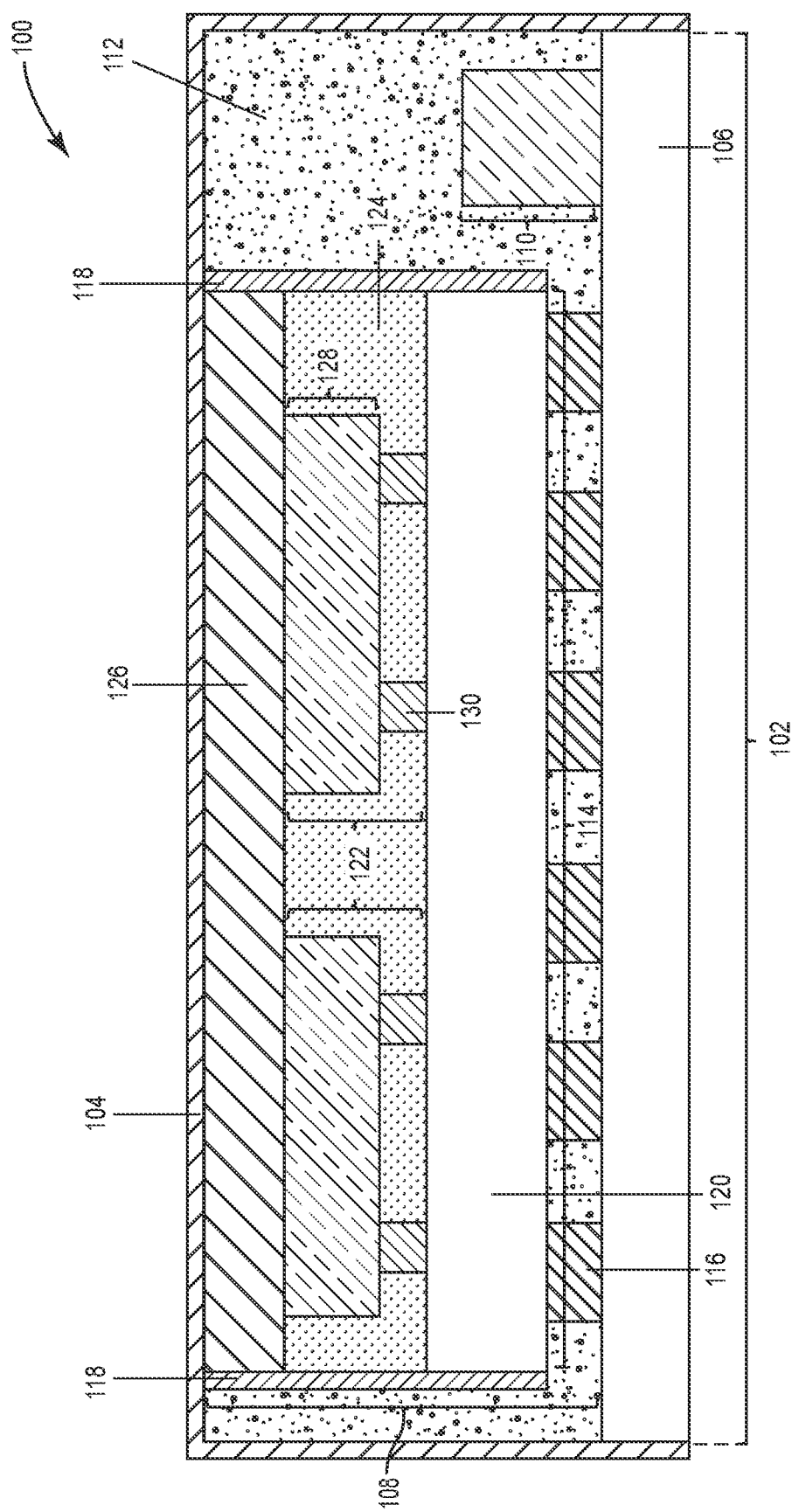

After the singulating step is completed, the module shielding structure 104 is applied to each electronic module 102 to form one shielded electronic module 100, as illustrated in FIG. 7. The module shielding structure 104 directly and completely covers the top surface and the side surface of the corresponding electronic module 102, while the bottom surface of the corresponding electronic module 102 is exposed. If the thinning step is processed as shown in FIG. 5A, the module shielding structure 104 may be applied to be in contact with the submodule side shielding structure 118, and if the thinning step is processed as shown in FIG. 5B, the module shielding structure 104 may be applied to be in contact with the submodule top shielding structure 118T (as shown in FIG. 1B). In either case, the electronic submodule 114 is fully and individually shielded (except the bottom surface of the electronic submodule 114).

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
an electronic module comprising an interposer, a first shielded electronic submodule attached to a top surface of the interposer, and a module mold compound, wherein:
the first shielded electronic submodule includes a first electronic submodule, a plurality of first submodule contacts extending from a bottom surface of the first electronic submodule to the top surface of the interposer, and a submodule side shielding structure, which covers a side surface of the first electronic submodule to provide a side surface of the first shielded electronic submodule;
the first electronic submodule includes a submodule substrate, at least one device die formed on the submodule substrate, and a submodule mold compound that is formed on the submodule substrate, horizontally surrounds the at least one device die, and underfills the at least one device die, wherein the bottom surface of the first electronic submodule is a bottom surface of the submodule substrate;
the module mold compound resides over the top surface of the interposer, encapsulates the side surface of the first shielded electronic submodule, and underfills the first shielded electronic submodule to fill gaps among the plurality of first submodule contacts vertically between the bottom surface of the first electronic submodule and the top surface of the interposer, wherein a top surface of the first shielded electronic submodule is not covered by the module mold compound; and
a top surface of the electronic module is a combination of the top surface of the first shielded electronic submodule and a top surface of the module mold compound, a bottom surface of the electronic module is a bottom surface of the interposer, and a side surface of the electronic module is a combination of a side surface of the interposer and a side surface of the module mold compound; and
a module shielding structure directly and continuously covering the top surface and the side surface of the electronic module, such that the submodule side shielding structure is electrically connected to the module shielding structure to individually shield the first electronic submodule.

2. The apparatus of claim 1 wherein the top surface of the first shielded electronic submodule is a combination of a cross-section surface of the submodule side shielding structure and a top surface of the first electronic submodule, such that the module shielding structure is in contact with the submodule side shielding structure.

3. The apparatus of claim 1 wherein:
the first shielded electronic submodule further includes a submodule top shielding structure that completely covers a top surface of the first electronic submodule and is directly connected to the submodule side shielding structure; and
the top surface of the first shielded electronic submodule is an outer surface of the submodule top shielding structure, such that the module shielding structure is in contact with the submodule top shielding structure.

4. The apparatus of claim 3 wherein:
the submodule side shielding structure comprises one or more of a group consisting of stainless steel, copper, aluminum, silver, gold, and nickel;
the submodule top shielding structure comprises one or more of a group consisting of stainless steel, copper, aluminum, silver, gold, and nickel; and
the module shielding structure comprises one or more of a group consisting of stainless steel, copper, aluminum, silver, gold, and nickel.

5. The apparatus of claim 4 wherein the submodule side shielding structure and the submodule top shielding structure have different layer configurations.

6. The apparatus of claim 4 wherein the submodule side shielding structure and the submodule top shielding structure have a same layer configuration.

7. The apparatus of claim 1 wherein:
the electronic module further includes a surface mounted device (SMD) attached to the top surface of the interposer; and
the module mold compound fully encapsulates the SMD.

8. The apparatus of claim 1 wherein the first electronic submodule further includes a thermally conductive component, wherein:
the thermally conductive component is over the at least one device die and the submodule mold compound, such that a top surface of the first electronic submodule is a top surface of the thermally conductive component, and the side surface of the first electronic submodule is a combination of a side surface of the submodule substrate, a side surface of the submodule mold compound, and the side surface of the thermally conductive component.

9. The apparatus of claim 8 wherein the at least one device die is one of a flip-chip die, a wire-bonding die, a SMD, and an inductor.

10. The apparatus of claim 1 wherein:
the submodule side shielding structure comprises one or more of a group consisting of stainless steel, copper, aluminum, silver, gold, and nickel; and
the module shielding structure comprises one or more of a group consisting of stainless steel, copper, aluminum, silver, gold, and nickel.

11. The apparatus of claim 1 wherein the electronic module further includes a second shielded electronic submodule attached to the top surface of the interposer, wherein:
the second shielded electronic submodule includes a second electronic submodule, a plurality of second submodule contacts extending from a bottom surface of the second electronic submodule to the top surface of the interposer, and a submodule shielding structure, which continuously covers a top surface and a side surface of the second electronic submodule, and individually shields the second electronic submodule within the electronic module; and
the module mold compound fully encapsulates the second shielded electronic submodule, such that the module shielding structure is not in contact with the submodule shielding structure of the second shielded electronic submodule.

12. The apparatus of claim 11 wherein:
the submodule side shielding structure of the first shielded electronic submodule comprises one or more of a group consisting of stainless steel, copper, aluminum, silver, gold, and nickel;
the submodule shielding structure of the second shielded electronic submodule comprises one or more of a group consisting of stainless steel, copper, aluminum, silver, gold, and nickel; and
the module shielding structure comprises one or more of a group consisting of stainless steel, copper, aluminum, silver, gold, and nickel.

13. The apparatus of claim 11 wherein:
the electronic module further includes an SMD attached to the surface of the interposer; and
the module mold compound fully encapsulates the SMD.

14. The apparatus of claim 13 wherein the SMD and the second shielded electronic submodule are located at opposite sides of the first shielded electronic submodule, such that the first shielded electronic submodule is capable of preventing electromagnetic radiation of the SMD from interfering with the second shielded electronic submodule.

15. The apparatus of claim 8 wherein the top surface of the first shielded electronic submodule is a combination of the top surface of the first electronic submodule and a cross-section surface of the submodule side shielding structure at the periphery of the first electronic submodule, such that the module shielding structure is in contact with the submodule side shielding structure.

16. The apparatus of claim 8 wherein:
the first shielded electronic submodule further includes a submodule top shielding structure that completely covers the top surface of the first electronic submodule and is directly connected to the submodule side shielding structure; and
the top surface of the first shielded electronic submodule is an outer surface of the submodule top shielding structure, such that the module shielding structure is in contact with the submodule top shielding structure.

17. The apparatus of claim 16 wherein:
the submodule side shielding structure comprises one or more of a group consisting of stainless steel, copper, aluminum, silver, gold, and nickel;
the submodule top shielding structure comprises one or more of a group consisting of stainless steel, copper, aluminum, silver, gold, and nickel; and
the module shielding structure comprises one or more of a group consisting of stainless steel, copper, aluminum, silver, gold, and nickel.

18. The apparatus of claim 17 wherein the submodule side shielding structure and the submodule top shielding structure have different layer configurations.

\* \* \* \* \*